(12) United States Patent
Brocke et al.

(10) Patent No.: US 8,319,676 B2
(45) Date of Patent: Nov. 27, 2012

(54) METHOD AND DEVICE FOR CONVERTING A DIGITAL INPUT SIGNAL TO AN ANALOG OUTPUT SIGNAL

(75) Inventors: Joachim Brocke, Gaimersheim (DE); Paul Schnebli, Ravensburg (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 119 days.

(21) Appl. No.: 13/020,134

(22) Filed: Feb. 3, 2011

(65) Prior Publication Data

US 2011/0187572 A1 Aug. 4, 2011

(30) Foreign Application Priority Data

Feb. 3, 2010 (DE) .......................... 10 2010 006 634

(51) Int. Cl.
*H03M 1/60* (2006.01)
(52) U.S. Cl. ........................................ 341/157; 341/155
(58) Field of Classification Search .................. 341/155, 341/157; 375/238
See application file for complete search history.

(56) References Cited

U.S. PATENT DOCUMENTS

| | | | |
|---|---|---|---|
| 6,307,494 B2 | 10/2001 | Bolz | |
| 7,545,223 B2* | 6/2009 | Watanabe | 331/17 |
| 8,169,211 B2* | 5/2012 | Huang | 324/76.77 |
| 2008/0062028 A1* | 3/2008 | Chang | 341/155 |
| 2009/0295612 A1 | 12/2009 | Wall | |
| 2010/0302085 A1 | 12/2010 | Chemisky et al. | |

FOREIGN PATENT DOCUMENTS

| | | |
|---|---|---|
| DE | 198 28 399 | 11/1999 |
| DE | 102007046560 | 4/2009 |

OTHER PUBLICATIONS

German Search Report for German Application No. 10 2010 006 634.6, dated Dec. 17, 2010, 4 pages, with English translation, 4 pages, Muenchen, Germany.

* cited by examiner

*Primary Examiner* — Peguy Jean Pierre
(74) *Attorney, Agent, or Firm* — W. F. Fasse

(57) ABSTRACT

A method and a device are for converting a digital input signal to an analog output signal, for example in vehicle safety systems. In the method, a first and a second pulse-width modulated signal is used for generating a first and a second analog intermediate signal. The second intermediate signal is converted to a third intermediate signal, wherein this conversion is controlled by a third pulse-width modulated signal. A fourth analog intermediate signal is generated from the third intermediate signal. The analog output signal is then generated from the first intermediate signal and the fourth intermediate signal. The first, second and/or third pulse-width modulated signal is preferably but not necessarily derived from the same digital input signal.

13 Claims, 2 Drawing Sheets

METHOD AND DEVICE FOR CONVERTING A DIGITAL INPUT SIGNAL TO AN ANALOG OUTPUT SIGNAL

PRIORITY CLAIM

This application is based on and claims the priority under 35 USC 119 of German Patent Application 10 2010 006 634.6, filed on Feb. 3, 2010, the entire disclosure of which is incorporated herein by reference.

FIELD OF THE INVENTION

The present invention relates to a method and a device for converting a digital input signal to an analog output signal.

BACKGROUND INFORMATION

Methods and/or devices of the generic kind mentioned above are used in nearly all fields of electrical engineering in which digitally determined data have to be transmitted in analog form to corresponding signal receivers. An important field of application is in vehicle safety systems.

The conversion of digital values into analog signals is usually performed with digital-to-analog converters (DAC) which are in most cases available as integrated circuits. The prices of such converters rise disproportionately to the increases in conversion resolution and speed.

Another, less expensive method is the use of pulse-width modulation systems (PWM). The required PWM signals are generated from digital signals with variable pulse width and subsequently low-pass filtered. One disadvantage of this alternative method is that the resolution depends on the time base of the PWM frequency. This leads to a conflict of objectives between resolution and achievable conversion rate. Another disadvantage is that the signal level of the analog signal to be generated depends on the signal level of the PWM signals, which can make additional adaptation circuits (attenuators, amplifiers, level shifters, etc.) necessary.

Applications often require the highest possible resolution in a precisely given voltage range and at the same time a high conversion rate.

Many applications also require different voltage ranges of the analog output signals. These voltage ranges exhibit manufacturing tolerances. In addition, the voltage ranges vary due to influences of the environment, especially changes of the ambient temperature, and also depending on the lifespan of the signal converter or owing to controlled influences, i.e. intentional adjustment of operating points.

The time base for the pulse-width signal cannot be increased infinitely in most applications. If performing a conversion based on the pulse-width modulation method, the high conversion resolution at a given time base requires a longer signal time and hence a lower signal frequency of the pulse-width modulated intermediate signal. This in turn leads to a lower conversion rate and thus to a slowdown of conversion. The longer signal time also increases the complexity of the subsequent low-pass filtering of the pulse-width modulated intermediate signal, since a low cut-off frequency is required there.

SUMMARY OF THE INVENTION

An object of the present invention is therefore to provide a method and/or device for converting a digital input signal to an analog output signal that minimizes the disadvantages mentioned above.

The problem is solved according to the invention with a method comprising the following steps. In the first step, a first and second pulse-width modulated signal is used for generating a first and second analog intermediate signal. The second intermediate signal is converted to a third intermediate signal, said conversion being controlled by a third pulse-width modulated signal. A fourth analog intermediate signal is generated from the third intermediate signal. The analog output signal is then generated from the first intermediate signal and the fourth intermediate signal. The first, second and/or third pulse-width modulated signal is preferably but not necessarily derived from the same digital input signal.

In a preferred embodiment, the second intermediate signal is converted to a third intermediate signal, said conversion being controlled by a third pulse-width modulated signal, and the third intermediate signal is converted by filtering to the fourth analog intermediate signal, wherein the signal portions of the second intermediate signal can pass to the third intermediate signal during the turn-on time and/or pulse duration of the third pulse-width modulated signal, and the signal portions of the second intermediate signal cannot pass to the third intermediate signal during the turn-off time of the third pulse-width modulated signal. During the turn-off time of the third pulse-width modulated signal, an additional reference signal can pass to the third intermediate signal instead of the second intermediate signal, said reference signal being for example an analog signal and being typically but not necessarily a static signal.

The first intermediate signal and the fourth intermediate signal are then superimposed to form the analog output signal, preferably by an adder circuit. The first pulse-width modulated signal is used for regulating the offset proportion of the analog output signal. The second pulse-width modulated signal is used for regulating the distance between the maximum and the minimum value in the analog output signal. The first and second pulse-width modulated signals are preferably set by way of manual or automatic calibration before or during operation of a corresponding device performing this method. The third pulse-width modulated signal, however, is preferably generated from the digital input signal.

The invention's object is further achieved with a device, wherein said device has
 a. a first means for generating a first, second and/or third pulse-width modulated signal in dependence on the digital input signal,
 b. a second means for converting the first pulse-width modulated signal to a first analog intermediate signal,
 c. a third means for converting the second pulse-width modulated signal to a second analog intermediate signal,
 d. a fourth means for converting the second analog intermediate signal to a third intermediate signal,
 e. a fifth means for converting the third intermediate signal to a fourth analog intermediate signal,
 f. a sixth means for combining the first intermediate signal and the fourth intermediate signal to the analog output signal.

The fourth means converts in said device the second analog intermediate signal to the third intermediate signal, said conversion being controlled by the third pulse-width modulated signal, wherein the fourth means lets the signal portions of the second intermediate signal pass to the third intermediate signal during the turn-on time and/or pulse duration of the third pulse-width modulated signal, and does not let the signal portions of the second intermediate signal pass to the third intermediate signal during the turn-off time of the third pulse-width modulated signal. Instead, the fourth means lets a preferably analog reference signal with a given reference potential pass to the third intermediate signal during the turn-off time of the third pulse-width modulated signal.

For this purpose the fourth means has a controllable switch which is constituted as switchable between two input terminals. The second intermediate signal is applied to a first input terminal and the reference signal with the reference potential is applied to a second input terminal.

The switch switches between the two input terminals, the switching being controlled by the third pulse-width modulated signal, thus transmitting either the second intermediate signal or the reference signal to the output terminal.

The abovementioned first means is preferably a microprocessor or a microcontroller and has at least three outputs for a pulse-width modulated signal. The first means usually generates all three pulse-width modulated signals from the digital input signal.

The sixth means has a superimposing circuit, typically an adder, which sums the first intermediate signal and the fourth intermediate signal to the analog output signal.

The present invention creates a method and/or device for converting a digital input signal to an analog output signal, said method or device being cheaper than known methods or devices and also easier to implement.

BRIEF DESCRIPTION OF THE DRAWINGS

In the following the invention will be explained in detail by means of the embodiments and with the aid of the figures. The figures show.

DETAILED DESCRIPTION OF EXAMPLE EMBODIMENTS OF THE INVENTION

Figure 1:
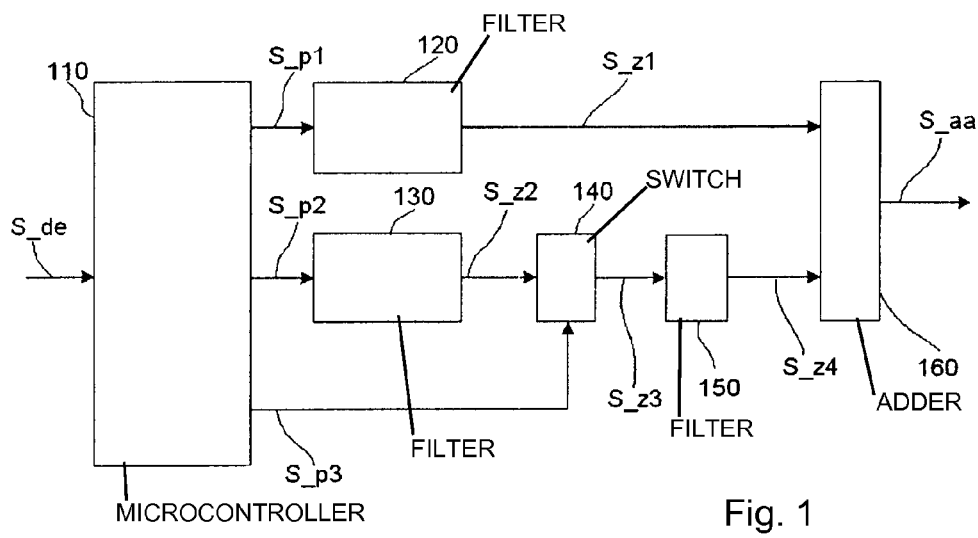
FIG. 1 the method of the invention, using a block diagram.

FIG. 1 shows the method of the invention using a block diagram. According to this, three pulse-width modulated signals (PWM signals) $S\_p1$, $S\_p2$, $S\_p3$ are generated.

The first PWM signal $S\_p1$ is used here to generate an offset proportion of the analog output signal $S\_aa$. The second PWM signal $S\_p2$ is used to adjust the possible voltage swing of the analog output signal $S\_aa$ to the application. The third PWM signal $S\_p3$ is used to adjust the analog output signal $S\_aa$ within the limits predetermined by $S\_p1$ and $S\_p2$, wherein, independent of $S\_p1$ and $S\_p2$, the maximum number of quantization levels and hence the highest possible resolution is always available. These three PWM signals $S\_p1$, $S\_p2$, $S\_p3$ are preferably generated independently of each other, and the signal times of the three PWM signals $S\_p1$, $S\_p2$, $S\_p3$ are adjustable independently of each other. Therefore the resolutions of the analog intermediate signals $S\_z1$, $S\_z2$, $S\_z3$ generated from the PWM signals $S\_p1$, $S\_p2$, $S\_p3$, i.e. by low-pass filtering, are also adjustable independently of each other.

These three signals can all be generated directly or indirectly from the digital input signal $S\_de$ which is to be converted to an analog output signal $S\_aa$ according to the invention.

The first PWM signal $S\_p1$ (hereinafter referred to as offset PWM signal) and the second PWM signal $S\_p2$ (hereinafter referred to as range PWM signal) are adjusted, depending on the application, once during the calibration of the device of the invention, either during the manufacturing process or following the manufacturing process, on repeated manual calibration during the product life cycle of the device, by automatic calibration at regular intervals during runtime operation of the device, or by automatic calibration at irregular intervals during runtime operation of the device, said automatic calibration being triggered by external or internal events or by user intervention.

In this way the work range or voltage range of the analog output signal $S\_aa$ can be optimally adjusted to the application.

The third PWM signal $S\_p3$ can then be adjusted depending on the digital input signal. With the third PWM signal $S\_p3$, the work range limited by the range PWM signal $S\_p2$ can be optimally resolved.

Since the offset and range PWM signals $S\_p1$, $S\_p2$ are only adjusted on demand and thus provide mostly static signals during the actual digital-to-analog conversion, the filtering of these signals $S\_p1$, $S\_p2$ to analog intermediate signals $S\_z1$, $S\_z2$ does not have a negative impact on the conversion time or conversion rate. The actual conversion is only controlled by the third PWM signal $S\_p3$.

The three PWM signals $S\_p1$, $S\_p2$ and $S\_p3$ can be output signals of a microcontroller 110. The source of the three PWM signals $S\_p1$, $S\_p2$, $S\_p3$ is totally irrelevant in this respect. They can be derived from the digital input signal $S\_de$, but also from one or several analog signals not detailed in this embodiment, or from measured signals received through an interface. The offset and range PWM signals $S\_p1$, $S\_p2$, which can be calibrated, can also be saved in a memory before processing and read on demand.

Figure 2:
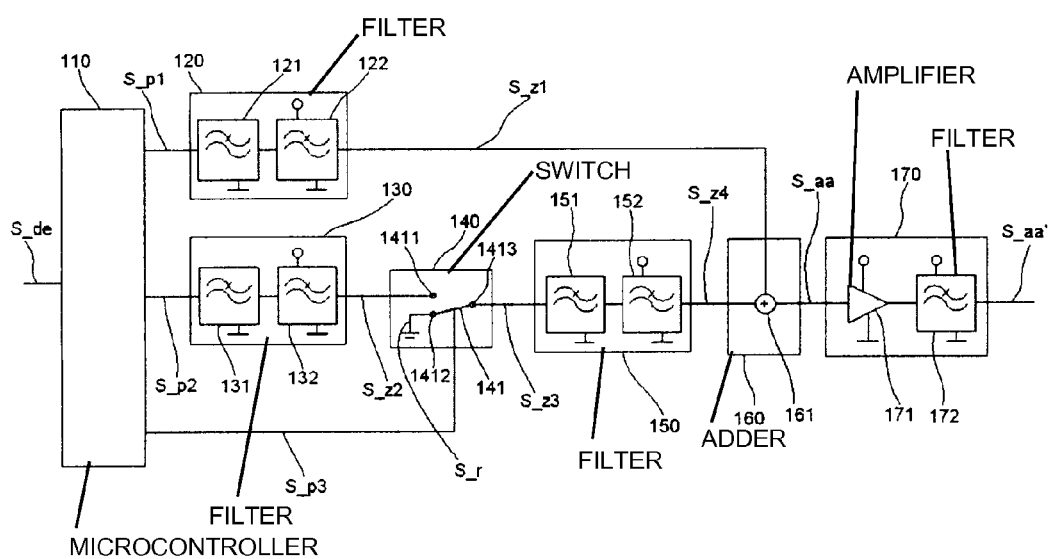
FIG. 2 an exemplary wiring diagram of the device of the invention.

As shown in FIG. 2, the analog intermediate signals $S\_z1$, $S\_z2$ are generated from the corresponding PWM signals $S\_p1$, $S\_p2$ using low-pass filtering 120, 130, wherein the two PWM signals $S\_p1$, $S\_p2$ are filtered each by a passive and subsequently by an active low-pass filter 121, 131, 122, 132 according to FIG. 2. Alternatively the low-pass filtering 120, 130 can be achieved with one low-pass filter or with one or several low-pass filters of other known filter types. The passive low-pass filters 121, 131 serve to suppress high frequency components of the offset and range PWM signals $S\_p1$, $S\_p2$. The active low-pass filters 122, 132 serve to decouple the impedances of the intermediate signals $S\_z1$, $S\_z2$ from the output terminals of the microcontroller 110.

Figure 3:
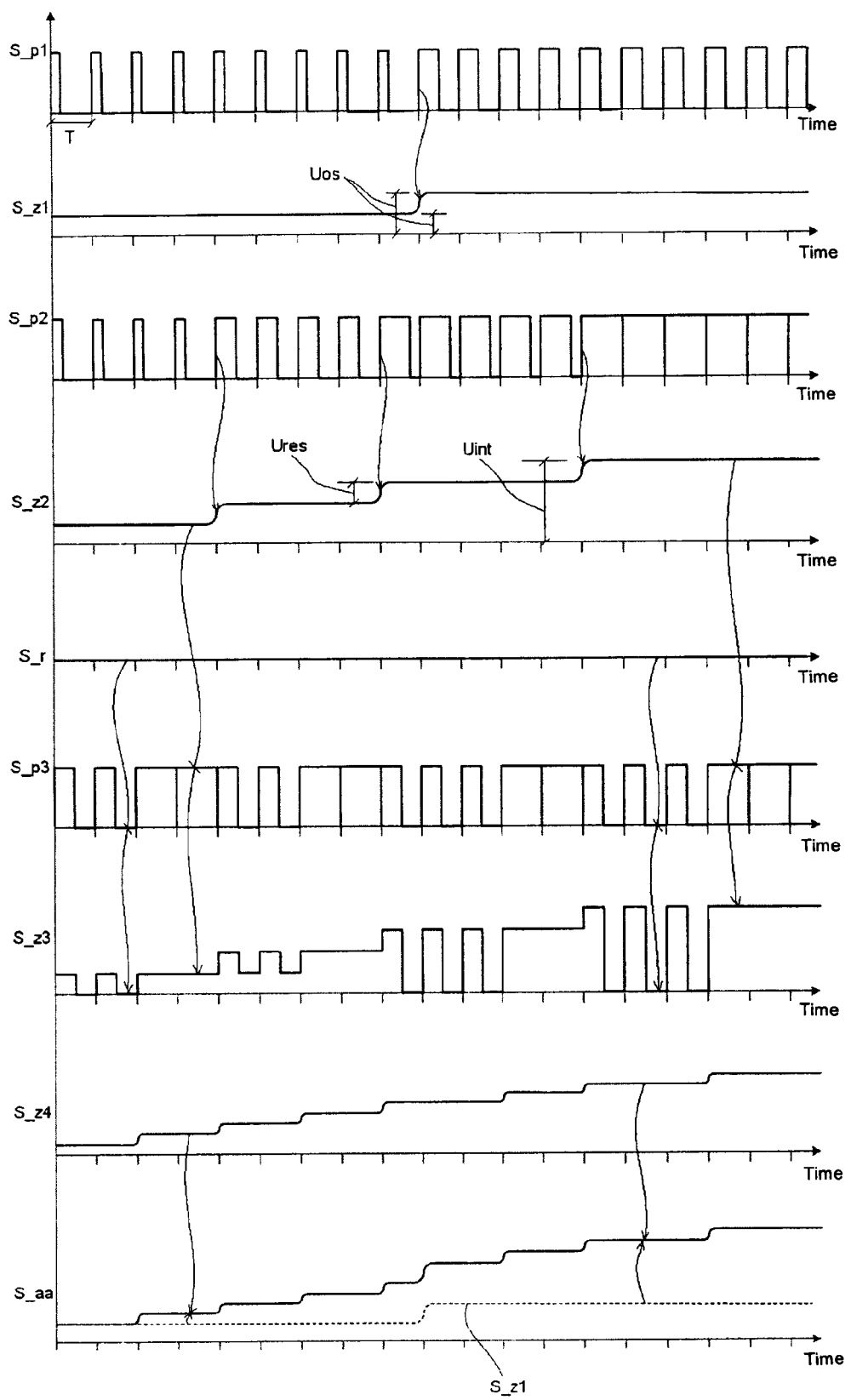
FIG. 3 a signal diagram for describing the method of the invention.

The first analog intermediate signal $S\_z1$ (hereinafter referred to as offset signal) is used for offset compensation on the analog output signal $S\_aa$ or for raising the total signal level of the output signal $S\_aa$ to fulfill specified signal level requirements. The voltage level Uos of the offset signal $S\_z1$ is adjustable by changing the signal level of the offset PWM signal $S\_p1$ correspondingly, as shown in FIG. 3. The lower voltage limit of the output signal $S\_aa$ is determined by the offset signal $S\_z1$. The offset signal $S\_z1$ is fed to an adder 160, 161.

The second analog intermediate signal $S\_z2$ (hereinafter referred to as range signal) determines the voltage interval of the analog output signal $S\_aa$, which is the interval in which the voltage level of the output signal $S\_aa$ can vary. Added to the offset signal $S\_z1$, the range signal $S\_z2$ forms the upper voltage limit of the output signal $S\_aa$. The range signal $S\_z2$ is fed to a controllable analog switch 140, 141, wherein said range signal $S\_z2$ is applied to a first input terminal 1411. A second input terminal 1412 of the switch 141 is fed with a reference signal $S\_r$. The reference signal $S\_r$ is preferably a zero signal (a signal with level 0). The switch 141 is driven by a third PWM signal S_p3, wherein said switch 141 lets either the range signal S_z2 or the reference signal S_r pass to the switch output 1413, controlled by the third PWM signal S_p3. Unlike the other two PWM signals S_p1, S_p2, the third PWM signal S_p3 is directly applied to switch 141 without filtering. As a result a third intermediate signal S_z3 is generated at output 1413 of switch 141, said third intermediate signal S_z3 being converted to a fourth analog intermediate signal S_z4 by low-pass filtering 150 through, for example, a passive and an active low-pass filter 151, 152, as shown in FIG. 3. This fourth analog intermediate signal S_z4 is also passed to the adder 160, 161.

The adder 161 adds both the second and the fourth intermediate signals S_z2, S_z4 together, thus generating the analog output signal S_aa. Optionally, said analog output signal is amplified and signal noise is filtered out 171, 172.

The voltage range of the analog output signal S_aa converted according to the invention has a value range that can be freely adapted to the respective application thanks to the range PWM signal S_p2, said value range being independent of the signal level of the output terminals of the microcontroller 110. In addition, the output signal S_aa has a high signal resolution, depending on the signal level of the third PWM signal S_p3.

The complete circuit of the device of the invention, as shown in FIG. 2, and/or all circuit components like the filters 121, 122, 131, 132, 151, 152, 172, the operational amplifier 171 and the analog switch 141 can be powered by a single voltage source.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims. The abstract of the disclosure does not define or limit the claimed invention, but rather merely abstracts certain features disclosed in the application.

REFERENCE SYMBOL LIST

S_de digital input signal
S_aa analog output signal
S_p1 first pulse-width modulated signal
S_p2 second pulse-width modulated signal
S_p3 third pulse-width modulated signal
S_z1 first analog intermediate signal
S_z2 second analog intermediate signal
S_z3 third intermediate signal
S_z4 fourth analog intermediate signal
S_r reference signal
110 first means for generating a first, second and/or third pulse-width modulated signal S_p1, S_p2, S_p3
120 second means for converting the first pulse-width modulated signal S_p1 is to a first analog intermediate signal S_z1
121 passive filter
122 active filter
130 third means for converting the second pulse-width modulated signal S_p2 to a second analog intermediate signal S_z2
131 passive filter
132 active filter
140 fourth means for converting the second analog intermediate signal S_z2 to a third intermediate signal S_z3
141 controllable switch in the fourth means 140
1411, 1412 input terminal of switch 141
1413 output terminal of switch 141
150 fifth means for converting the third intermediate signal S_z3 to a fourth analog intermediate signal S_z4
151 passive filter
152 active filter
160 sixth means for adding the first intermediate signal S_z1 and the fourth intermediate signal S_z4 to the analog output signal S_aa microprocessor in the first means 110
161 adder in the sixth means 160
170 amplifier unit
171 amplifier
172 active filter
Uos voltage level of offset signal S_z1
Ures manually adjustable maximum voltage range of the second analog intermediate signal S_z2
Uint voltage level of the second analog intermediate signal S_z2 which is adjustable by changing the signal level of the second offset PWM signal S_p2 correspondingly

What is claimed is:

1. A method for converting a digital input signal (S_de) to an analog output signal (S_aa),
   characterized by the following steps:
   a) generating an analog first intermediate signal (S_z1) from a first pulse-width modulated signal (S_p1),
   b) generating an analog second intermediate signal (S_z2) from a second pulse-width modulated signal (S_p2),
   c) converting the second intermediate signal (S_z2) to a third intermediate signal (S_z3), said conversion being controlled by a third pulse-width modulated signal (S_p3),
   d) generating an analog fourth intermediate signal (S_z4) from the third intermediate signal (S_z3), and
   e) generating the analog output signal (S_aa) from the first intermediate signal (S_z1) and the fourth intermediate signal (S_z4),
   f) wherein said first, second and/or third pulse-width modulated signal (S_p1, S_p2, S_p3) is derived from the digital input signal (S_de).

2. The method according to claim 1,
   wherein, in said step d), the third intermediate signal (S_z3) is converted by filtering to the fourth intermediate signal (S_z4),
   wherein signal portions of the second intermediate signal (S_z2) can pass to the third intermediate signal (S_z3) during a turn-on time and/or a pulse duration of the third pulse-width modulated signal (S_p3), and
   wherein signal portions of the second intermediate signal (S_z2) cannot pass to the third intermediate signal (S_z3) during a turn-off time of the third pulse-width modulated signal (S_p3).

3. The method according to claim 2, wherein a reference signal (S_rp) can pass to the third intermediate signal (S_z3) during the turn-off time of the third pulse-width modulated signal (S_p3).

4. The method according to claim 1, wherein, in said step e), the first intermediate signal (S_z1) and the fourth intermediate signal (S_z4) are added together to form the analog output signal (S_aa).

5. The method according to claim 1, wherein the first pulse-width modulated signal (S_p1) is used for regulating an offset proportion of the analog output signal (S_aa) and is set by way of calibration.

6. The method according to claim 1, wherein the second pulse-width modulated signal (S_p2) is used for regulating a distance between a maximum value and a minimum value in the analog output signal (S_aa) and is set by way of calibration.

7. The method according to claim 1, wherein, in said step f), the third pulse-width modulated signal (S_p3) is generated from the digital input signal (S_de).

8. A device for converting a digital input signal (S_de) to an analog output signal (S_aa), characterized in that said device has
- a first means (110) for generating a first, second and/or third pulse-width modulated signal (S_p1, S_p2, S_p3),
- a second means (120) for converting the first pulse-width modulated signal (S_p1) to an analog first intermediate signal (S_z1),
- a third means (130) for converting the second pulse-width modulated signal (S_p2) to an analog second intermediate signal (S_z2),
- a fourth means (140) for converting the second intermediate signal (S_z2) to a third intermediate signal (S_z3),
- a fifth means (150) for converting the third intermediate signal (S_z3) to an analog fourth intermediate signal (S_z4), and
- a sixth means (160) for combining the first intermediate signal (S_z1) and the fourth intermediate signal (S_z4) to form the analog output signal (S_aa),
- wherein the first means (110) generates the first, second and/or third pulse-width modulated signal (S_p1, S_p2, S_p3) dependent on the digital input signal (S_de).

9. The device according to claim 8, wherein the fourth means (140) for converting the second intermediate signal (S_z2) to the third intermediate signal (S_z3) is controlled by the third pulse-width modulated signal (S_p3), wherein the fourth means (140) lets signal portions of the second intermediate signal (S_z2) pass to the third intermediate signal (S_z3) during a turn-on time and/or a pulse duration of the third pulse-width modulated signal (S_p3), and wherein the fourth means (140) does not let signal portions of the second intermediate signal (S_z2) pass to the third intermediate signal (S_z3) during a turn-off time of the third pulse-width modulated signal (S_p3).

10. The device according to claim 8, wherein
the fourth means (140) has a controllable switch (141),
said switch (141) is constituted as switchable between first and second input terminals (1411, 1412),
said first input terminal (1411) is fed with the second intermediate signal (S_z2) and said second input terminal (1412) is fed with a reference signal having a reference potential (S_rp), and
a switching of said switch (141) between said first and second input terminals (1411, 1412) is controlled by the third pulse-width modulated signal (S_p3), thus transmitting either the second intermediate signal (S_z2) or the reference signal (S_rp) to an output terminal (1413) of the switch (141).

11. The device according to claim 8, wherein the first means (110) is a microprocessor or a microcontroller and has at least one output for a pulse-width modulated signal.

12. The device according to claim 8, wherein the first means (110) generates the third pulse-width modulated signal (S_p3) from the digital input signal (S_de).

13. The device according to claim 8, wherein the sixth means (160) has an adder (161), wherein the adder (161) sums the first intermediate signal (S_z1) and the fourth intermediate signal (S_z4) to form the analog output signal (S_aa).

* * * * *